US006423987B1

(12) United States Patent
Constapel et al.

(10) Patent No.: US 6,423,987 B1
(45) Date of Patent: Jul. 23, 2002

(54) SELF-PROTECT THYRISTOR

(75) Inventors: Rainer Constapel, Frankfurt; Heinrich Sciilangenotto, Neu-Isenburg, both of (DE); Shuming Xu, Hillview Heights (SG)

(73) Assignee: Vishay Semiconductor GmbH, Heilbronn (DE)

( * ) Notice: Subject to any disclaimer, the term of this patent is extended or adjusted under 35 U.S.C. 154(b) by 0 days.

(21) Appl. No.: 09/424,367

(22) PCT Filed: Apr. 18, 1998

(86) PCT No.: PCT/EP98/02305

§ 371 (c)(1),
(2), (4) Date: Mar. 19, 2000

(87) PCT Pub. No.: WO98/53503

PCT Pub. Date: Nov. 26, 1998

(30) Foreign Application Priority Data

May 23, 1997 (DE) .......................................... 197 21 655

(51) Int. Cl.$^7$ ........................ H01L 29/74; H01L 31/119
(52) U.S. Cl. ........................ 257/173; 257/124; 257/160; 257/168; 257/162; 257/345; 257/107; 257/138; 257/140; 257/146
(58) Field of Search .............................. 257/124, 173, 257/160, 168, 162, 345, 107, 138, 140, 146

(56) References Cited

U.S. PATENT DOCUMENTS

| 3,802,769 A | 4/1974 | Rotz et al. | |
|---|---|---|---|
| 4,597,634 A | 7/1986 | Steenblik | |
| 4,723,081 A | * 2/1988 | Akatsuka | 307/200 |
| 5,111,313 A | 5/1992 | Shires | |
| 5,379,133 A | 1/1995 | Kirk | |
| 5,631,494 A | * 5/1997 | Sakurai et al. | 257/572 |

FOREIGN PATENT DOCUMENTS

| DE | 44 02 877 C2 | 12/1995 |
|---|---|---|
| DE | 196 27 122 A1 | 1/1998 |
| EP | 0 039 941 A1 | 5/1981 |
| EP | 03025490 | 4/1991 |
| JP | 09107091 | 4/1997 |

OTHER PUBLICATIONS

Henri–Pierre Penel, "Télévision: L'ère de la nouvelle," *Science & Vie*, Jan. 1995, pp. 68–72.
Graham Saxby, *Hologrammes de la prise de vue à leur présentation*, Annexe 4, pp. 163–164, and pp. 128–131.
Richard, "Smart Driver IC Protects High–Speed IGBTs and MOSFETs Against Short Circuits", *PCIM*, Feb. 1997, pp. 28–39.
Reinmuth, "Intelligent Low Side Switch Provides Full Protection in High Current Applications", *PCIM*, Jan. 1997, pp. 42–49.

\* cited by examiner

*Primary Examiner*—David E. Graybill
*Assistant Examiner*—James Mitchell
(74) *Attorney, Agent, or Firm*—Venable; Norman N. Kunitz

(57) ABSTRACT

With a self-protect thyristor, having a MOSFET (M1) that is connected in series with the thyristor and a second, self-controlled MOSFET (M2) between the p-base of the thyristor and the external cathode (KA), several unit cells for the thyristor are arranged parallel connected in a semiconductor wafer. The voltage at the series MOSFET (M1) functions as an indicator for the overcurrent and excess temperature, and an additional MOSFET (M4) is provided where source (region) is connected conducting to the source of the series MOSFET (M1), where drain is conductivity connected with the gate of the series MOSFET (M1) and where gate conductivity connected with the drain of the series MOSFET (M1). A resistance ($R_g$) is provided between the gate electrode (G1) of the series MOSFET (M1) and the gate (G) of the thyristor.

8 Claims, 7 Drawing Sheets

SELF-PROTECT THYRISTOR

BACKGROUND OF THE INVENTION

The invention relates to a MOS gate-controlled thyristor with overcurrent protection having a MOSFET connected in series with the thyristor and a second, self-controlled MOSFET between the p-base of the thyristor and the external cathode, and wherein several unit cells of the thyristor are connected in parallel in a semiconductor wafer.

In case of an overcurrent, components with a self-limiting characteristic, e.g. the bipolar transistor, the power MOSFET and the insulated-gate bipolar transistor (IGBT), can be protected from destruction by using of external electronic equipment for shutting down. Electronic equipment of this type for shutting down is very expensive and requires a great deal of space. In addition, it frequently cannot be used because the saturation current for the components is too high in many cases. These disadvantages can be avoided with an integrated, quickly reacting overcurrent protection. Power MOSFETs with integrated overcurrent protection are suggested by R. Reinmuth and L. Lorenz: Intelligent Low Side Switch Provides Full Protection in High Current Applications. PCIM, January 1997, pp 41–49. An IGBT with integrated protective function is disclosed in the publication by R. Redl et al: Smart Driver IC Protects High-Speed IGBTs and MOSFET against Short Circuits. PCIM, February 1997, pp 28–39.

Protective measures are very important in case of a short-circuit because thyristors normally are used in the high-capacity range. In case of an overcurrent, thyristors are normally shut down by external, passive fuses. These and other methods are involved and relatively expensive because of the external wiring and also with respect to the space requirement.

MOS gate-controlled thyristors without overcurrent protection are known, for example, from German Patent 44 02 877 C2 and German Patent 196 27 122 A1, wherein the controlling MOSFETs are integrated into the thyristor structure with semiconductor technology. In addition to a MOSFET connected in series with the thyristor and henceforth called a series MOSFET, each unit cell of the thyristor contains a shutdown MOSFET, which is arranged between the p-base of the thyristor and the cathode and is activated automatically, as soon as the series MOSFET is shut down by its gate. As a result of the opened bypass to the cathode, the charge carriers are pulled from the thyristor structure, so that the component begins to block quickly. This shutdown structure corresponds to a known GTO cascode circuit.

In addition, some of the unit cells of the semiconductor structure are provided with a switch-on MOSFET, which is arranged between the n-emitter and the n-base of the thyristor and is provided with a gate that is connected to the gate for the series MOSFET. During the activation of the switch-on MOSFET and the series MOSFET, the anode-side pnp-transistor structure is driven high, so that the thyristor is fired and the component is switched on.

An MOS gate-controlled thyristor with overcurrent protection is also disclosed in the JP 09107091 A, in particular in FIG. 7 therein. The semiconductor structure (76) shown therein contains a thyristor with a series-connected first MOSFET (72) and a switch-on MOSFET (73), as well as a self-controlling overcurrent protection, as disclosed in the English-language abstract in "Patent Abstracts of Japan".

The voltage on a detector (14) is used to activate the overcurrent protection. Together with a switch (13), this detector forms a parallel branch to the thyristor (76) with the series MOSFET (72). The current through the parallel branch determines the detector voltage and is used as measure for the thyristor current. The detector signal is supplied as gate-source voltage to a switch 15, preferably designed as MOSFET, which is arranged between the gate (79) of the series MOSFET (72) and the cathode (K) of the thyristor. If the detector voltage exceeds the threshold voltage of switch 15, this switch must change to the ON state and connect the gate of the series MOSFET (72) with the cathode (K) or the source of the series MOSFET (72). As a result, the voltage V2 at the gate (79) of the series MOSFET is lowered, that is to say corresponding to the voltage separation by the ON resistance of switch 15 and the gate series resistance 71. If the voltage V2 falls below the threshold voltage, then the component is shut down. In the inhibiting case, the switch 13 as well as the thyristor have to absorb all the voltage. The switch 13 therefore requires considerable expenditure.

That is obviously the reason why the overcurrent protection circuit was realized as external wiring. An integration with the aid of an IGBT for switch 13, for example, would require a large semiconductor surface, so that the saturation current that is reduced as a result of the gate voltage is still sufficient to generate the required detector voltage for switching on the switch 15.

In addition, the effectiveness of the protective circuit is in doubt, at least for a wide range of the overcurrent since the detector 14 and the MOSFET switch 15 mutually obstruct each other.

Given a normal current, the protective circuit must meet the requirement that the voltage at the detector is considerably lower than the threshold voltage of switch 15 since the current below the threshold value of switch 15 otherwise would lead to an undesirable leakage current for the external gate (79). In case of an overcurrent, on the other hand, the current in the detector branch must drop drastically and in time, so that the detector voltage clearly exceeds the threshold voltage of switch 15. Only in that case is the ON resistance of switch 15 low enough, so that the series MOSFET 72 and the complete component can be shut down or at least the current can be reduced sufficiently.

With the component according to FIG. 7 of the JP 09107091, this is not possible because the thyristor 76 does not shut down even after the MOSFET 7 is shut down, but initially continues to carry the complete overcurrent as a result of the avalanche breakdown. The gate-cathode voltage of switch 13 decreases with increasing detector voltage since it is smaller by the detector voltage than the gate-source voltage of the series MOSFET 72. As a rule, the latter is specified to be constant. As a result of the decrease in the gate voltage at switch 13, the current in the thyristor increases since the decrease in the gate voltage can be compensated only by a strong increase in the anode-cathode voltage at switch 13 . The latter (U at 13), however, is also smaller by the detector voltage than the anode-cathode voltage and thus increases at a slower rate when the current rises than the anode-cathode voltage. The current in the detector branch therefore can increase only with extremely high overcurrents to the required degree and can trigger a shutdown. The circuit therefore does not react or not quickly enough for a wide range of the overcurrent.

SUMMARY OF THE INVENTION

It is the object of the invention to create an overcurrent and excess temperature protection for MOS-controlled thyristors, which reacts quickly and is easy to realize.

The above object generally is achieved according to the invention by a MOS gate-controlled thyristor with overcurrent protection, wherein several unit cells of the thyristor are arranged in a semiconductor wafer and connected in parallel, and comprising:

an n-emitter, a p-base, an n-base and a p-emitter arranged sequentially between a cathode connection and an anode connection;

a MOSFET of the enhancement type connected in series with the thyristor and having a gate electrode that is connected to an external gate connection;

at least some of the unit cells of the thyristor containing a switch-on MOSFET that connects the n-base with the n-emitter when the thyristor is switched on;

a self-controlled overcurrent protection arrangement that detects the current flowing through the thyristor and, depending on this current, controls the gate voltage at the gate electrode of the series MOSFET; and wherein:

the self-controlled overcurrent protection arrangement is in the form of an additional MOSFET of the enhancement type integrated into the semiconductor wafer;

the drain source voltage at the series MOSFET serves as an indicator for the current and controls the additional MOSFET, in that the additional MOSFET has its source conductively connected to the source of the series MOSFET, its drain conductively connected with the gate electrode of the series MOSFET and its gate conductively connected with the drain of the series MOSFET;

a series resistance is connected between the gate electrode of the series MOSFET and the gate connection;

when the additional MOSFET becomes conductive, the ON resistance of this additional MOSFET together with the series resistance forms a voltage divider that lowers the gate voltage at the gate electrode of the series MOSFET.

The essence of the invention is that an MOS thyristor, controlled by a series MOSFET, comprises between gate and source of the series MOSFETs an additional MOSFET, which in turn is controlled by the drain source voltage of the series MOSFETs and shuts down the series MOSFET if a specific voltage is exceeded. As a result, the component is provided with an I-U characteristic curve where the current with increasing voltage not only moves toward a saturation value, but clearly decreases starting with an adjustable voltage.

The advantage of this current limitation is that no external protective circuit is necessary. Another advantage is that even when the normal operating temperature of 20–80° C. is exceeded, the current intensity immediately drops drastically and the energy dissipated throughout the component drops to an uncritical value.

The invention can be used with all MOS-controlled thyristors in a cascode circuit and with ESTs. These also include components on the basis of SiC or III–V compounds, such as GaAs.

In the following, the invention is described in further detail with the aid of exemplary embodiments in silicon technology, as shown in the drawing.

DESCRIPTION OF THE PREFERRED EMBODIMENT

The operational mode of the component must be understood as follows:

With a MOS thyristor, having a MOSFET M1 that is connected in series with the thyristor and is controlled by an external gate, another MOSFET M4 is integrated between gate and source of the series MOSFT, wherein its gate is connected to the drain contact of the series MOSFET. The MOSFET M4 thus is controlled by the drain-source voltage of the series MOSFET M1.

If the current flowing through the component increases strongly, so that the drain source voltage of M1 exceeds the threshold voltage of M4, the MOSFET M4 is activated. As a result, the gate of M1, which is connected via a series resistor to the gate voltage source, is discharged and the gate voltage of M1 decreases. The current is thus reduced throughout the component. The drain-source voltage of the series MOSFET M1 in this way is used as sensor signal for the overcurrent.

Figure 1:
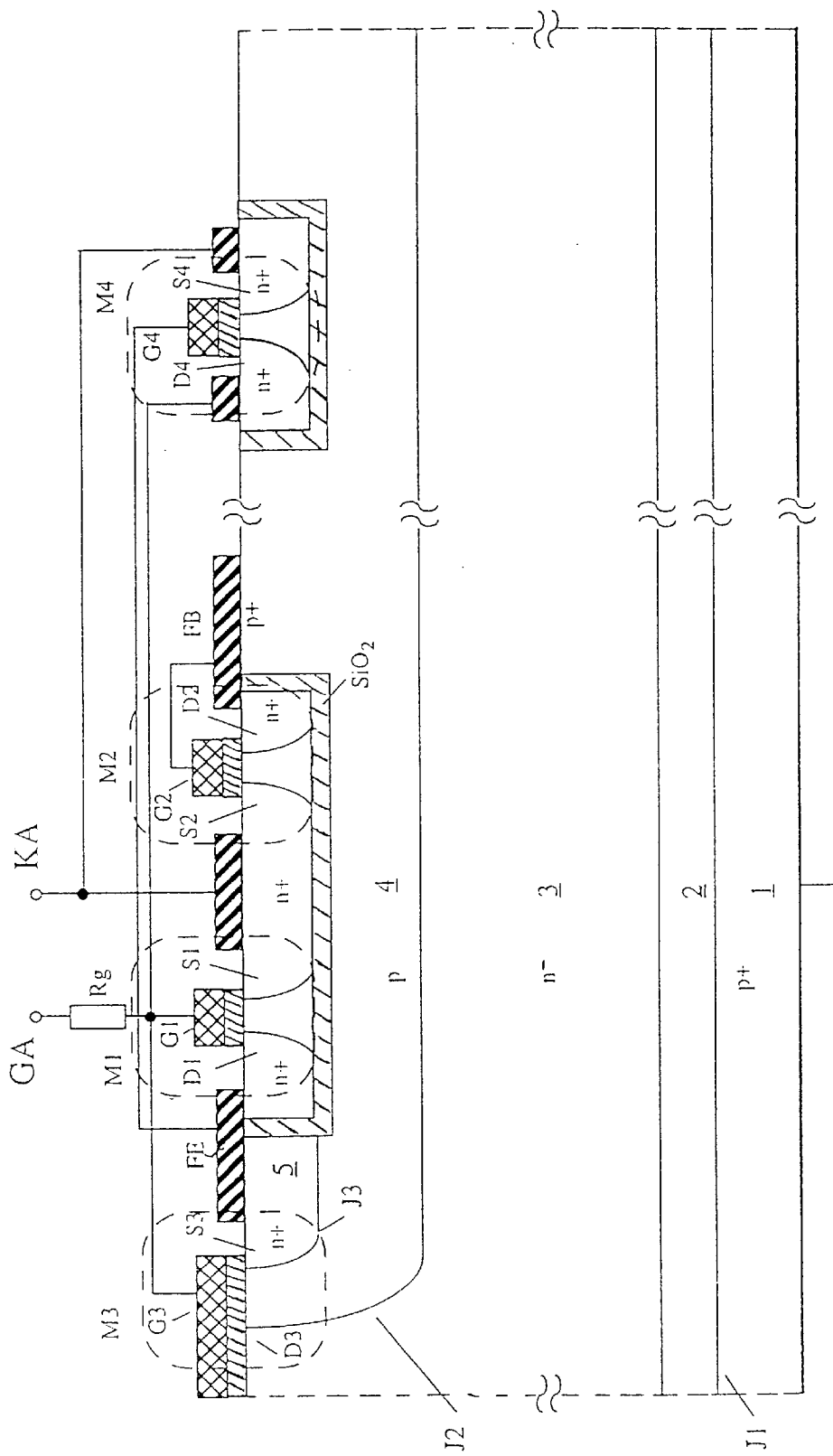
FIG. 1 shows a MOS thyristor that can be produced with SIMOX technology.

FIG. 1 shows the use of the invention for a cascade-controlled MOS thyristor based on German Application 196 27 122 A1. The MOSFET M4 is added opposite the known MOS thyrister (see also FIG. 2). The MOSFETs are n-channel MOSFETs of the enhancement type. The source region S4 of M4 is connected to the external cathode connection KA, which leads to the source region S1 of series MOSFET M1. The drain region D4 of M4 is connected to the gate electrode G1 of M1. A series resistance $R_g$ is arranged between the external gate connection G1 and the drain of M4. The gate of M4 is connected via the floating emitter contact FE to the drain of M1, so that the MOSFET M4 is controlled by the drain-source voltage of the series MOSFET M1.

Figure 2:
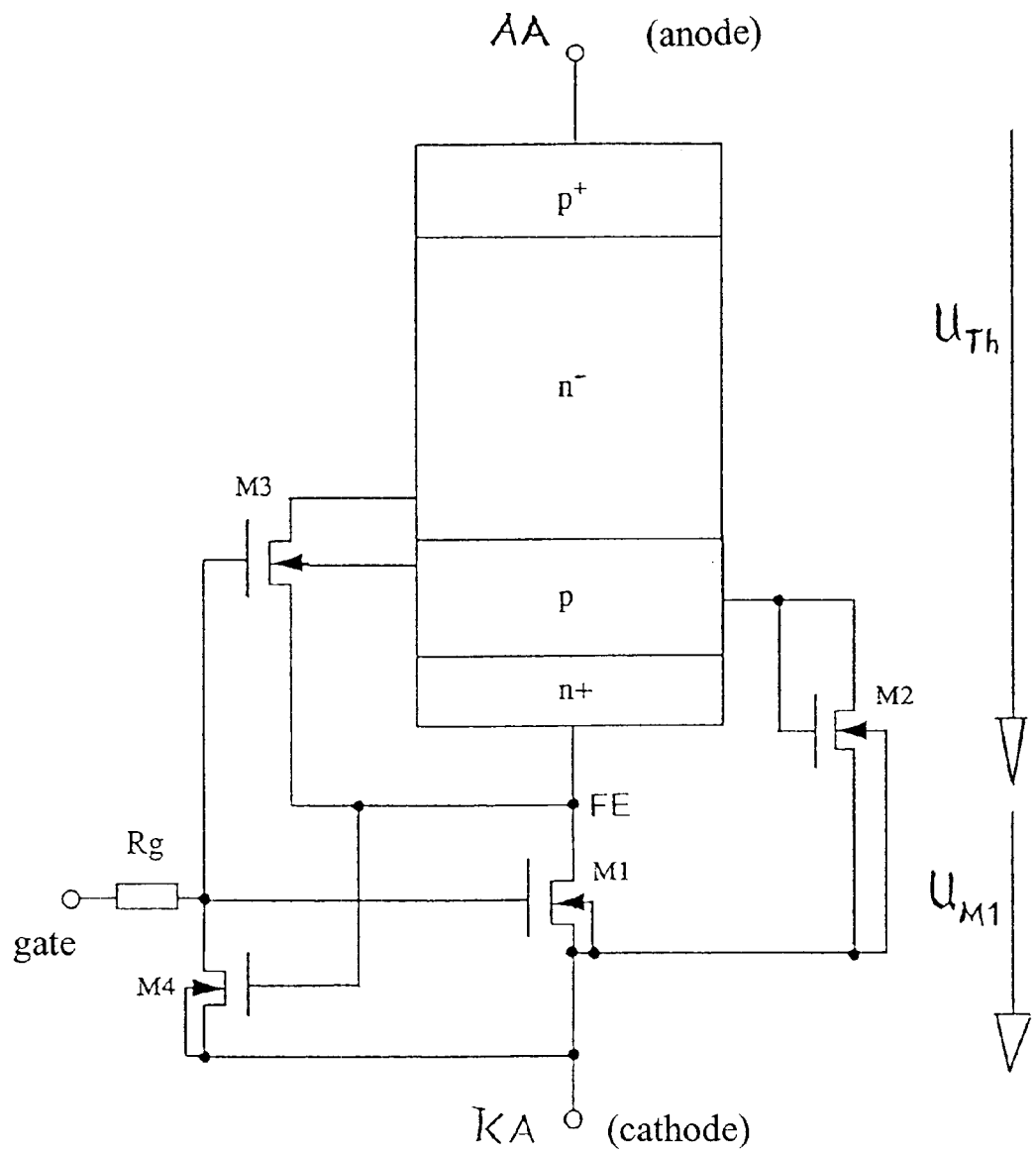
FIG. 2 shows the associated basic wiring diagram.

FIG. 2 contains the basic wiring diagram for the component according to FIG. 1. The series-connected MOSFET M1, the shutdown MOSFET M2, the switch-on MOSFET M3, as well as the protective MOSFET M4 are shown in this Figure with their electrical association. The operational mode of the MOSFETs has already been described. The equivalent diagram in FIG. 2 only applies exactly to the arrangement shown in FIG. 1. For all later examples, the diagram must be modified, but only slightly. However, all examples contain a series MOSFET, the drain voltage of which is supplied to the gate of a MOSFET M4, which is located between gate and source of the series MOSFET.

The voltage at the component is composed of the thyristor voltage $U_{TH}$ between the anode connection AA and the floating cathode FE on the one side and the voltage $U_{M1}$ on the series MOSFET M1 between FE and the external cathode KA on the other side. In the conducting condition, $U_{Th}=1.2-1.3$ V and $U_{M1}=0.4-0.6$ V for normal operating currents. However, if the current flowing through the component increases to high values, owing to an interruption or short-circuit, then the drain-source voltage of the series MOSFET M1 also increases. With a specific current, $U_{M1}$ exceeds the threshold voltage of the MOSFET M4, so that the MOSFET M4 is activated. With this, positive charge is discharged from the gate G1 over the MOSFET M4 to the outer cathode KA, so that the gate-source voltage of M1 decreases. With a constant current, the drain-source voltage of M1 and thus the gate-source voltage of M4 increases. As a result, the resistance of the activated MOSFET M4 decreases further. The gate voltage of the series MOSFET decreases at an even faster rate, so that the current through the series MOSFET is reduced. With this, the component protects itself.

The structure according to the invention also offers protection against excessive temperatures.

As a result of the series connection of main thyristor and MOSFET M1, the associated voltage drops add up in the activated state of the anode voltage, as previously mentioned:

$$U_A = U_{TH} + U_{M1}$$

Figure 3A:
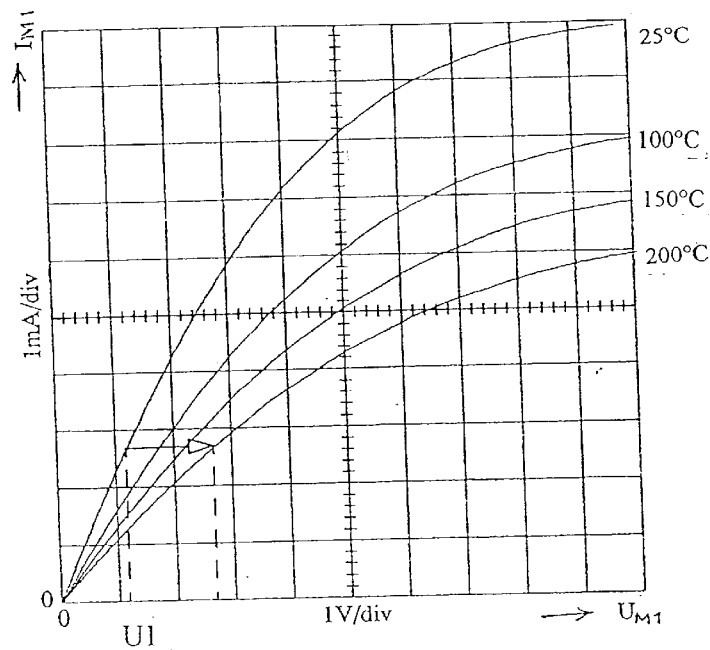
FIG. 3a shows the current flowing through the MOSFET M1 in dependence on the drain source voltage $U_{M1}$ with the Temperature as parameter.

FIG. 3a shows that the voltage drop (drain-source voltage) $U_{M1}$ over M1 increases with the temperature if the current remains constant. The voltage drop $U_{M1}$ at 25° C., for example, is U1=0.6 V (point 1 in FIG. 3a) for a specific current $I_{M1}$. At 200° C., the voltage drops climbs to 1.35 V (see point 2). This leads to an increase in the potential at the floating cathode FE and thus also at the gate G4 of M4. On the other hand, the threshold voltage of NMOS transistors decreases if the temperature increases. If the potential FE exceeds the threshold voltage of M4, then M4 is activated. As a result, the gate G1 of M1 is discharged and the gate bias voltage of M1 is reduced. However, this causes a further drop in the voltage $U_{M1}$ and a further increase in the potential at the point FE, which results in a low channel resistance at the gate MOSFET M4. The gate bias voltage of the series MOSFET M1 is thus further reduced and its internal resistance increased strongly. With this, the current through the component is reduced and the component protects itself.

Figure 3B:
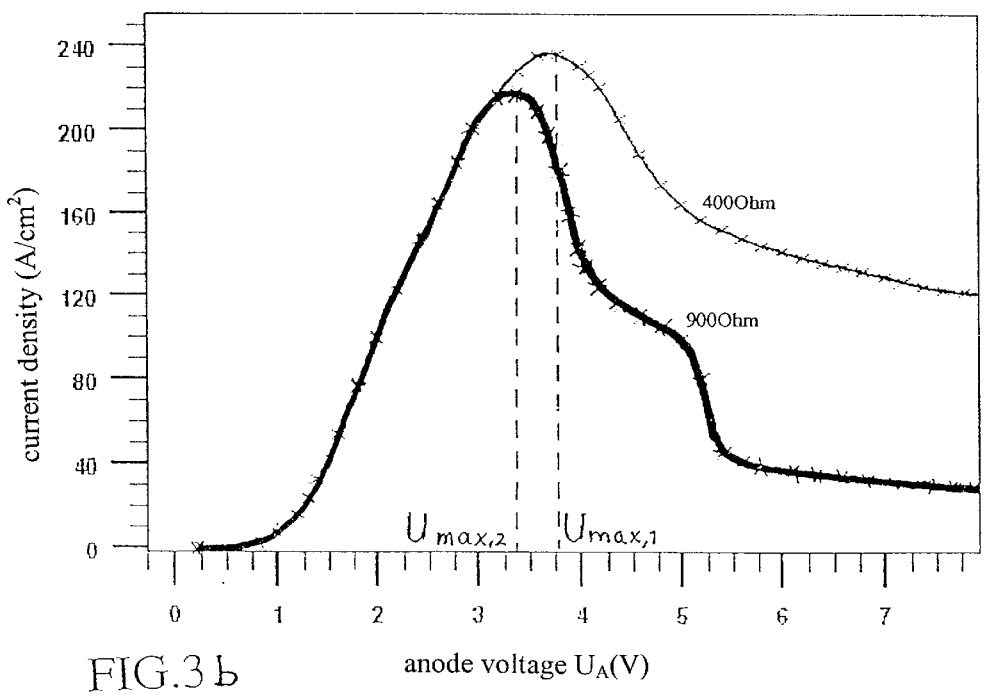
FIG. 3b shows the current voltage characteristic for two different series resistors $R_g$.

The voltage $U_{max}$ at which the current intensity reaches its maximum value is adjusted by selecting the series resistor $R_g$ based on the user specifications. A small resistor $R_g$ means a high maximum current value; a large value for resistor $R_g$ results in a small maximum value. FIG. 3b clearly demonstrates these facts, which are additionally explained with a numbered example. If the resistance is $R_{g2}$=900 Ω for a channel length of 5 μm for M4 and a width of 1 mm, for example, then the maximum current density is always lower than for $R_{g1}$=400 Ω and is reached earlier with $U_{max,2} < U_{max,1}$. The resistance $R_g$ can be a normal ohmic resistance, but it is preferable if a MOSFET channel with adjustable resistance is used.

The MOSFET M4 does not have to be present in each unit cell, but is arranged usefully in a separate surface area of the component. Since it must carry only a low current for discharging the gate of the series MOSFET, the required surface area is small. One advantage of the component shown in FIG. 1, for example, is that the MOSFET M4 can be produced at the same time as the MOSFETs M1 and M2, without additional processing steps.

Figure 4:
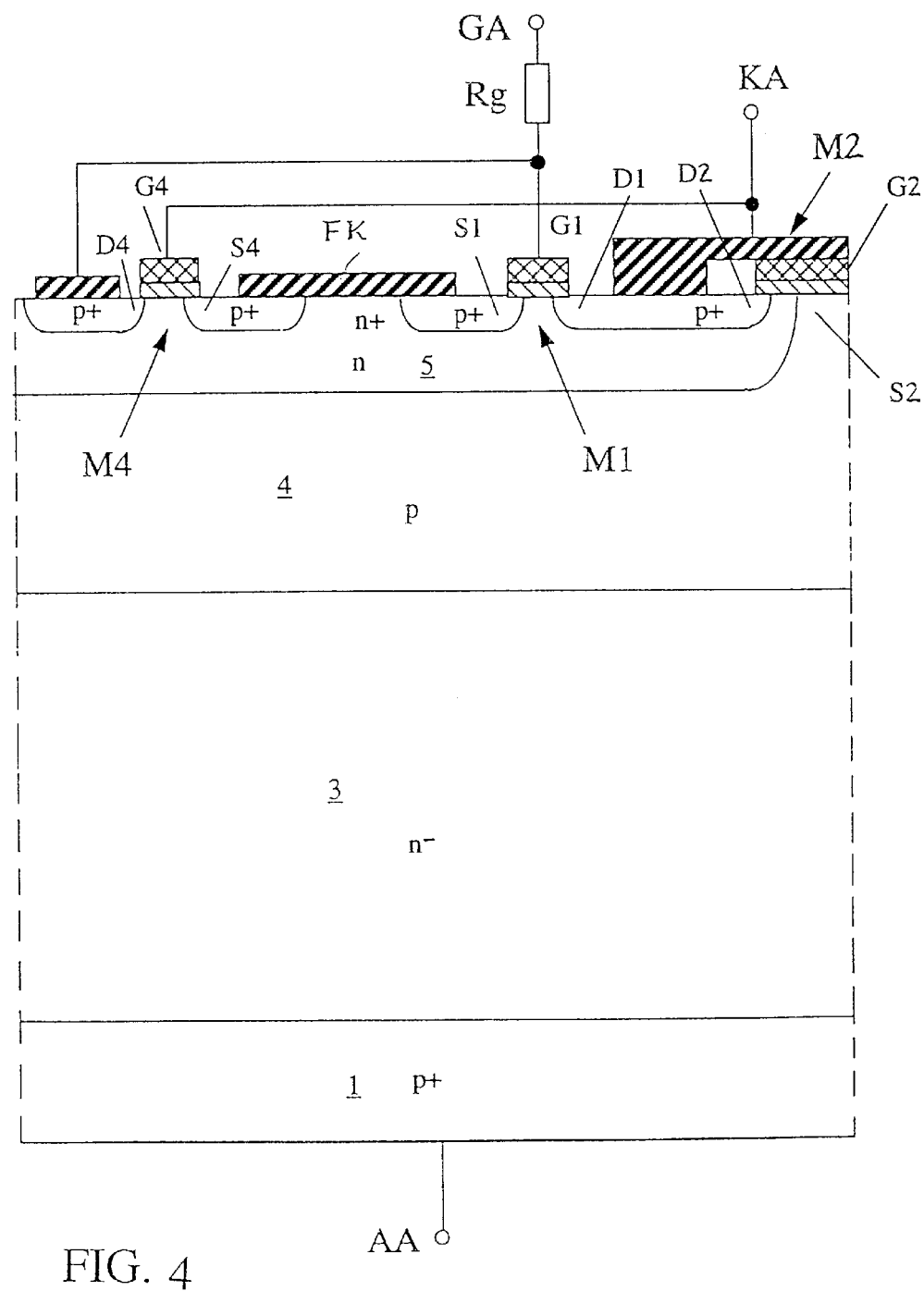
FIG. 4 shows a MOS thyristor with 5 layers of alternately opposite conductance type.

FIG. 4 shows another example of a MOS-controlled thyristor with integrated overcurrent protection. The MOS thyristor per se is again provided with a cascode configuration (see German Patent 44 02 877 C2).

The thyristor structure 1, 3, 4, 5 comprises in the n-emitter zone 5 a PMOSFET M1, the source region S1 of which is connected by way of a floating contact FK to the n-emitter zone 5 of the thyristor while its drain region D1 is connected to the external cathode KA. The MOSFET M1 thus is connected in series with the thyristor. At the edge of the n-emitter zone 5 is a MOSFET M2, the source region S2 of which is formed by the surface region of the p-base zone 4 of the thyristor while the drain region D2 coincides with the drain region D1 of the MOSFET M1. Thus, the p-base 4 of the thyristor is connected through the MOSFET M2 with the external cathode KA.

According to the invention, a MOSFET M4 is integrated into the MOS thyristor structure, that is to say as PMOSFET in the n-emitter zone 5. The source $p^+$-region S4 of this MOSFET is connected to the source region S1 of the series MOSFET M1, the drain region S4 [sic] of M4 is connected to the gate G1 of M1. The MOSFET M4 is thus positioned between the gate and the source of M1. The gate G4 of M4 is thus connected to the external cathode KA. The gate-source voltage of the MOSFET M4 is thus supplied by the drain-source voltage of the series MOSFET M1. In addition to the MOSFET M4, the MOSFET M2 is also activated for an excessively high through current. The self-protect function of the component, described previously with the aid of FIG. 1, remains unchanged.

The start-up MOSFET M3, required for firing the thyristor, is not contained in the unit cell in FIG. 4 since a start-up MOSFET can supply several cells as a result of the self-propagation of the firing pulse, as shown in FIG. 4.

Figure 5:
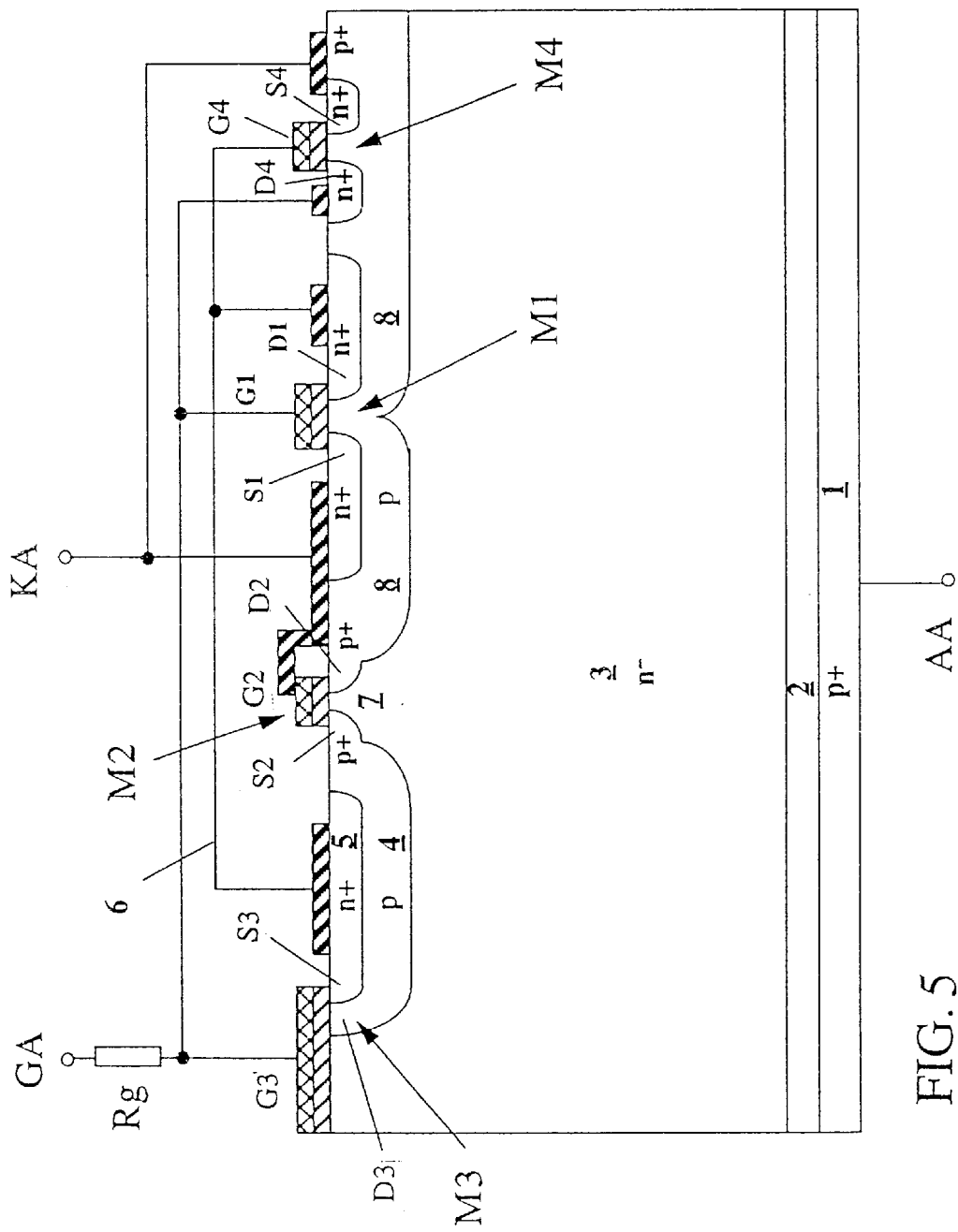
FIG. 5 shows an embodiment with 4 layers of alternately opposite conductance type, following each other vertically.

Another example of a structure according to the invention, with integrated overcurrent protection, is shown in FIG. 5. This component can be produced with the standard IGBT process. As for the case of a conventional EST, a NMOSFET M1 is connected in series with the main thyristor. An increase in the current through the main thyristor and the NMOSFET M1 means an increase in the voltage drop at the drain source, wherein the potential of the p-zone 4 and the n-zone 7 is raised. Consequently, the PMOSFET M2 is activated and connects the base with the cathode of the component. As a result of the activated state of the PMOSFET M2, holes drift from the p-zone 4 to the cathode KA and the current in the component becomes saturated.

If the current through the MOSFET M1 continues to increase, the voltage drop between drain and source increases as well. The NMOSFET M4 is activated after the potential of the drain region D1 in the NMOSFET M1 exceeds the threshold voltage of the NMOSFET M4 as a result of the connection between gate G4 in M4 and the drain region D1 in M1. In the activated state of the NMOSFET M4, the gate potential of the NMOSFET M1 and M3 moves down. As a result, the current flowing through M1 is reduced strongly and thus also the current flowing through the total component.

Figure 6:
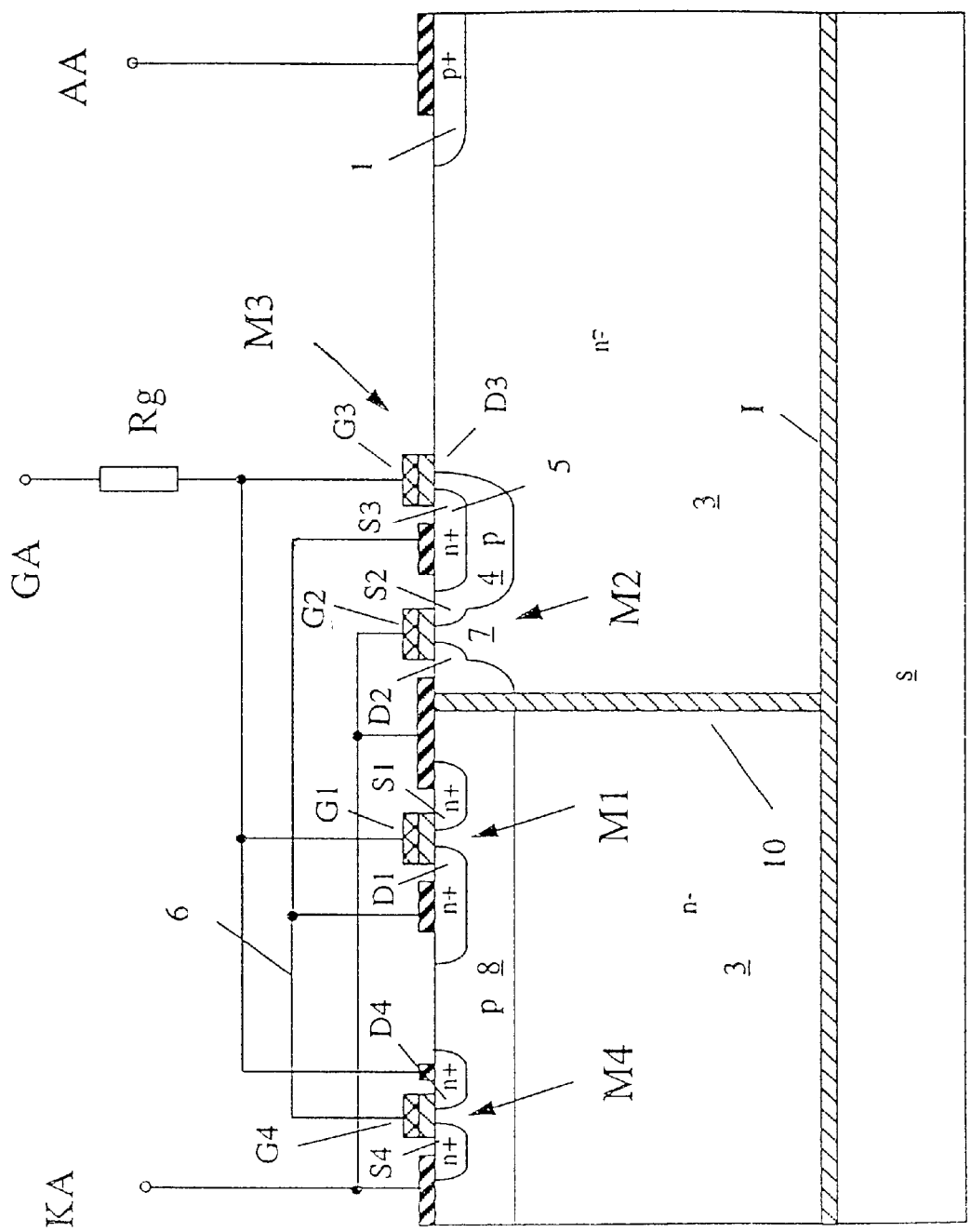
FIG. 6 shows a lateral embodiment that can be produced with SOI technology.

FIG. 6 shows a lateral structure of the component according to the invention. In order to produce this component, the MOSFETs M1 and M4 are produced in one insulated box and the MOSFETs M2 and M3 are produced in a second insulated box. On the one hand, the buried layer I is used for this and, on the other hand, the zone 10, which extends from the buried layer to the surface and insulates both partial regions or boxes against each other. As a result, the danger of the parasitic thyristor locking in place is avoided.

Figure 7:
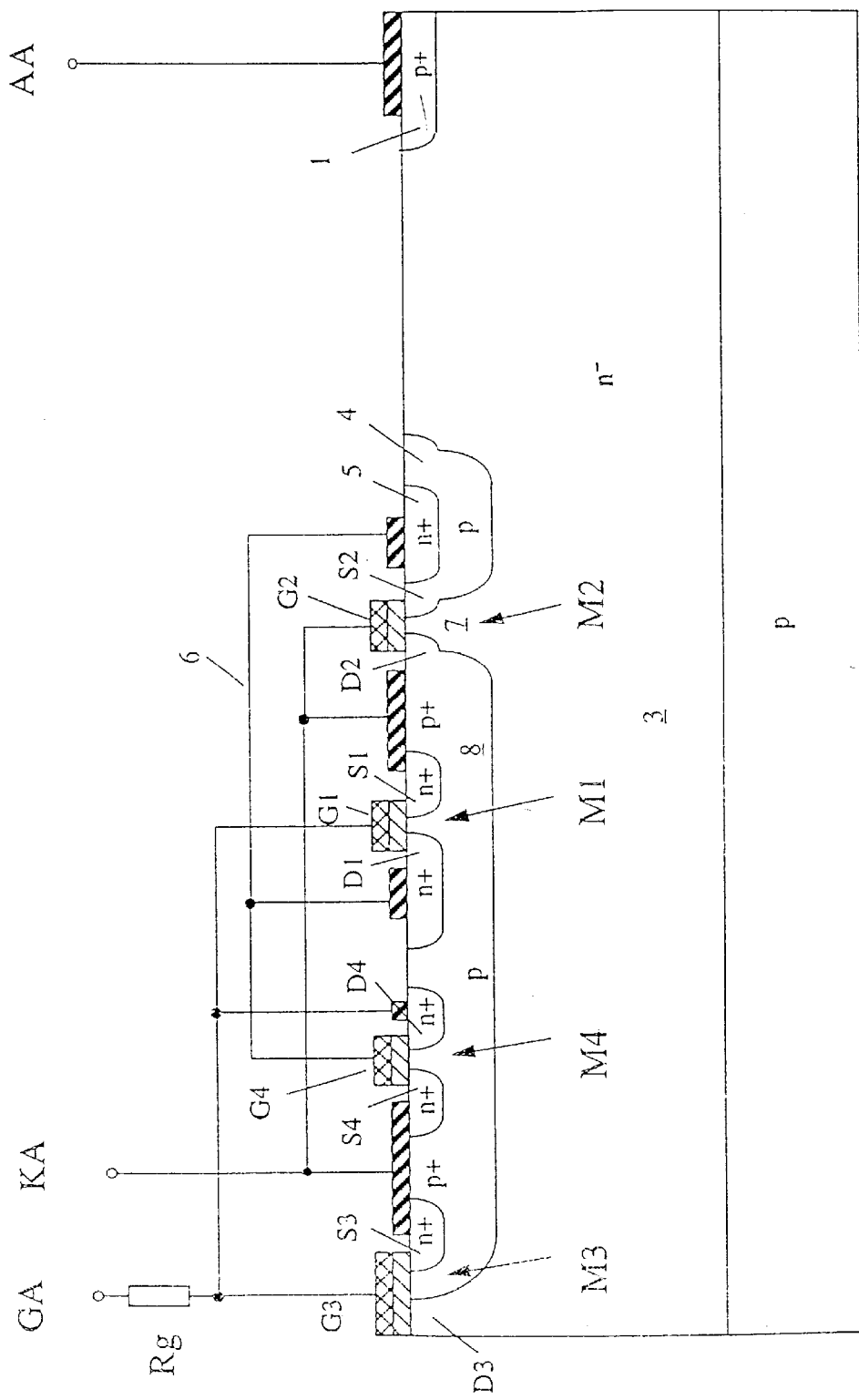
FIG. 7 shows a lateral embodiment without dielectric insulation.

FIG. 7 shows another lateral embodiment of the invention, for which the junction-insulation technology was used. The operation is identical to that of the preceding example (FIG. 6). The principle has already been described in detail with the aid of FIG. 1. The insulation layer 10 in FIG. 6 is not necessary here since the MOSFET M3 was moved to the other side of the arrangement.

What is claimed is:

1. A MOS gate-controlled thyristor with overcurrent protection, wherein several unit cells of the thyristor are arranged parallel-connected in a semiconductor wafer, comprising:
   a) respectively one n-emitter, one p-base, one n-base and one p-emitter, arranged between a cathode connection (KA) and an anode connection (AA),
   b) a series MOSFET (M1) of the enhancement type, which is connected in series with the thyristor and the gate electrode (G1) of which is connected to an external gate connection (GA),
   c) wherein at least some of the unit cells of the thyristor contain a switch-on MOSFET (M3), which connects the n-base with the n-emitter when the thyristor is switched on,
   d) wherein a self-controlled overcurrent protection is provided, which detects the current flowing through the thyristor and, depending on this, controls the gate voltage at the gate electrode of the series MOSFET (M1); and wherein
   e) the self-controlled overcurrent protection is in the form of an additional MOSFET (M4) of the enhancement type integrated into the semiconductor wager and
   f) the drain source voltage at the series MOSFET (M1) serves as an indicator for the current and controls the additional MOSFET (M4), in that
   g) its source is connected conducting to the source of the series MOSFET (M1), the drain of which is connected conducting with the gate electrode of the series MOSFET (M1) and the gate of which is connected conducting with the drain of the series MOSFET (M1).
   h) wherein a series resistance ($R_g$) is connected between the gate electrode (G1) of the series MOSFET (M1) and the gate connection (GA), and
   i) when the additional MOSFET (M4) becomes conductive, the ON resistance of this additional MOSFET (M4) together with the series resistance forms a voltage divider, which lowers the gate voltage at the gate electrode of the series MOSFET (M1).

2. A thyristor according to claim 1, wherein the series resistance ($R_g$) between the gate electrode (G1) of the series MOSFET (M1) and the gate connection (GA) has a higher resistance value than the ON resistance of the channel between source and drain of the additional MOSFET (M4) in the conductive state.

3. A thyristor according to claim 2, having a thyristor shutdown in case of excess temperatures, for which the source-drain voltage at the series MOSFET (M1) and the ON resistance of the additional MOSFET (M4) increase if the temperature increases, thereby leading to a reduction in the gate voltage at the gate electrode (G1).

4. A thyristor according to claim 3, wherein a shutdown MOSFET (M2) is additionally provided, the source and drain of which are arranged between the cathode connection (KA) and the p-base of the thyristor and the gate of which is connected to its drain, so that it is switched on if the series MOSFET (M1) is switched off and discharges the p-base.

5. A thyristor according to claim 1, characterized by a thyristor shutdown in case of excess temperatures, for which the source-drain voltage at the series MOSFET (M1) and the ON resistance of the additional MOSFET (M4) increase if the temperature increases,thereby leading to a reduction in the gate voltage at the gate electrode (G1).

6. A thyristor according to claim 5, characterized in that a shutdown MOSFET (M2) is additionally provided, the source and drain of which are arranged between the cathode connection (KA) and the p-base of the thyristor and the gate which is connected to its drain, so that it is switched on if the series MOSFET (M1) is switched off and discharges the p-base.

7. A thyristor according to claim 1, characterized in that a shutdown MOSFET (M2) is additionally provided, the source and drain of which are arranged between the cathode connection (KA) and the p-base of the thyristor and the gate of which is connected to its drain, so that it is switched on if the series MOSFET (M1) is switched off and discharges the p-base.

8. A thyristor according to claim 2, characterized in that a shutdown MOSFET (M2) is additionally provided, the source and drain of which are arranged between the cathode connection (KA) and the p-base of the thyristor and the gate of which is connected to its drain, so that it is switched on if the series MOSFET (M1) is switched off and discharges the p-base.

* * * * *

UNITED STATES PATENT AND TRADEMARK OFFICE
CERTIFICATE OF CORRECTION

PATENT NO. : 6,423,987 B1
DATED : July 23, 2002
INVENTOR(S) : Rainer Constapel, Heinrich Schlangenotto and Shuming Xu It is certified that error appears in the above-identified patent and that said Letters Patent is hereby corrected as shown below:

<u>Title page,</u>
Item [75], Inventors, should read:
-- [75] Inventors: Rainer Constapel; Frankfurt, Heinrich Schlangenotto; Neu-Isenburg both of (DE) and Shuming Xu; Santa Clara, CA --

Signed and Sealed this

Third Day of December, 2002

JAMES E. ROGAN
*Director of the United States Patent and Trademark Office*